US012650294B2

(12) United States Patent
Lengacher et al.

(10) Patent No.: US 12,650,294 B2
(45) Date of Patent: Jun. 9, 2026

(54) OPTICAL PLANAR METROLOGY MOUNTING DEVICE AND METHODS FOR ABRASIVE CROSS-SECTIONING OF ELECTRICAL COMPONENTS

(71) Applicant: The United States of America, as Represented by the Secretary of the Navy, Crane, IN (US)

(72) Inventors: Derek Lengacher, Bedford, IN (US); Derek Baker, Bloomfield, IN (US); Joshua M. Bennett, Bedford, IN (US); Joseph McNeill, Bloomington, IN (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 151 days.

(21) Appl. No.: 18/398,612

(22) Filed: Dec. 28, 2023

(65) Prior Publication Data

US 2025/0216190 A1 Jul. 3, 2025

(51) Int. Cl.
| | |
|---|---|
| *H05K 1/185* | (2026.01) |
| *G01B 9/04* | (2006.01) |
| *G01N 21/956* | (2006.01) |

(52) U.S. Cl.
CPC ............. *G01B 9/04* (2013.01); *G01N 21/956* (2013.01); *H05K 1/185* (2013.01); *G01N 2021/95661* (2013.01); *H05K 2201/09218* (2013.01)

(58) Field of Classification Search
CPC ................... G01B 9/04; G01N 21/956; G01N 2021/95661; H05K 1/185; H05K 2201/09218
See application file for complete search history.

(56) References Cited

U.S. PATENT DOCUMENTS

| | | | | |
|---|---|---|---|---|
| 2006/0048380 A1* | 3/2006 | Okuda | ................. | H05K 13/083 |
| | | | | 29/832 |
| 2007/0077011 A1* | 4/2007 | Whitehead | ........... | H05K 1/0269 |
| | | | | 385/88 |
| 2011/0156284 A1* | 6/2011 | Zhang | ................... | H10P 74/277 |
| | | | | 257/E23.179 |

(Continued)

FOREIGN PATENT DOCUMENTS

| | | | | | |
|---|---|---|---|---|---|
| GB | 2249672 A | * | 5/1992 | ........... | H05K 1/0269 |
| JP | 06104335 A | * | 4/1995 | | |
| JP | 2002100843 A | * | 4/2002 | | |

*Primary Examiner* — Michelle M Iacoletti
*Assistant Examiner* — Jarreas Underwood
(74) *Attorney, Agent, or Firm* — Naval Surface Warfare Center, Crane Division; Patrick B. Law

(57) ABSTRACT

Disclosed are apparatus and methods for optical planar metrology of electrical components utilizing cross-sectioning techniques. A disclosed apparatus includes at least one predefined geometric shape or array composed of a material and disposed on a surface of the circuit board in proximity to an electrical component under test. The shape or array creates an optically measureable unique feature for each cross sectional plane created during the performance of optical planar metrology regardless of depth or overall planarity. The geometry of the shape or array ensures a unique cross-sectional profile for every plane and the material of the shape or array (e.g., copper or a similar material having equivalent optical properties) allows for optical visibility and differentiation from surrounding materials.

20 Claims, 9 Drawing Sheets

(56)                    References Cited

U.S. PATENT DOCUMENTS

2021/0405269 A1*  12/2021  Dong ................... G02B 5/1852
2023/0180381 A1*   6/2023  Lee ...................... H05K 1/0269
                                                    257/797

* cited by examiner

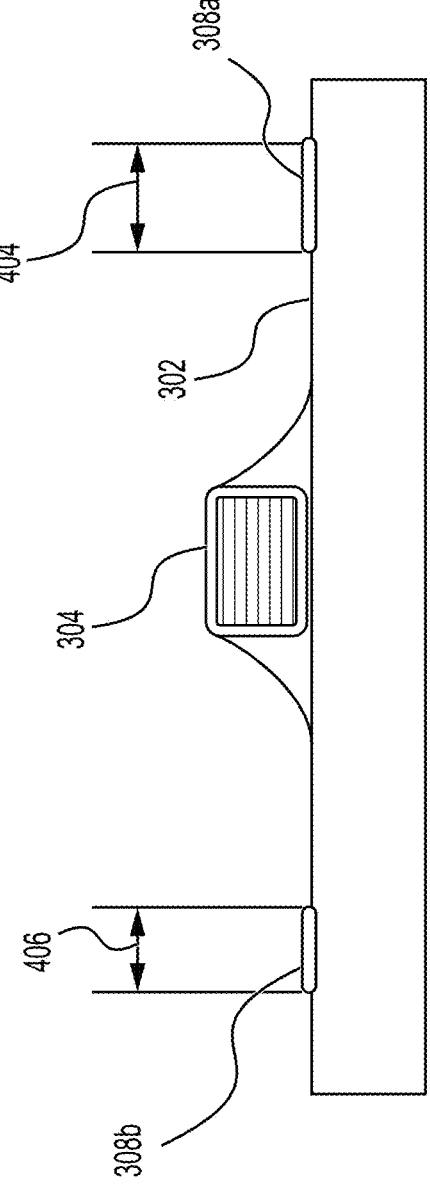
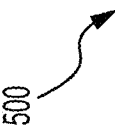
FIG. 5

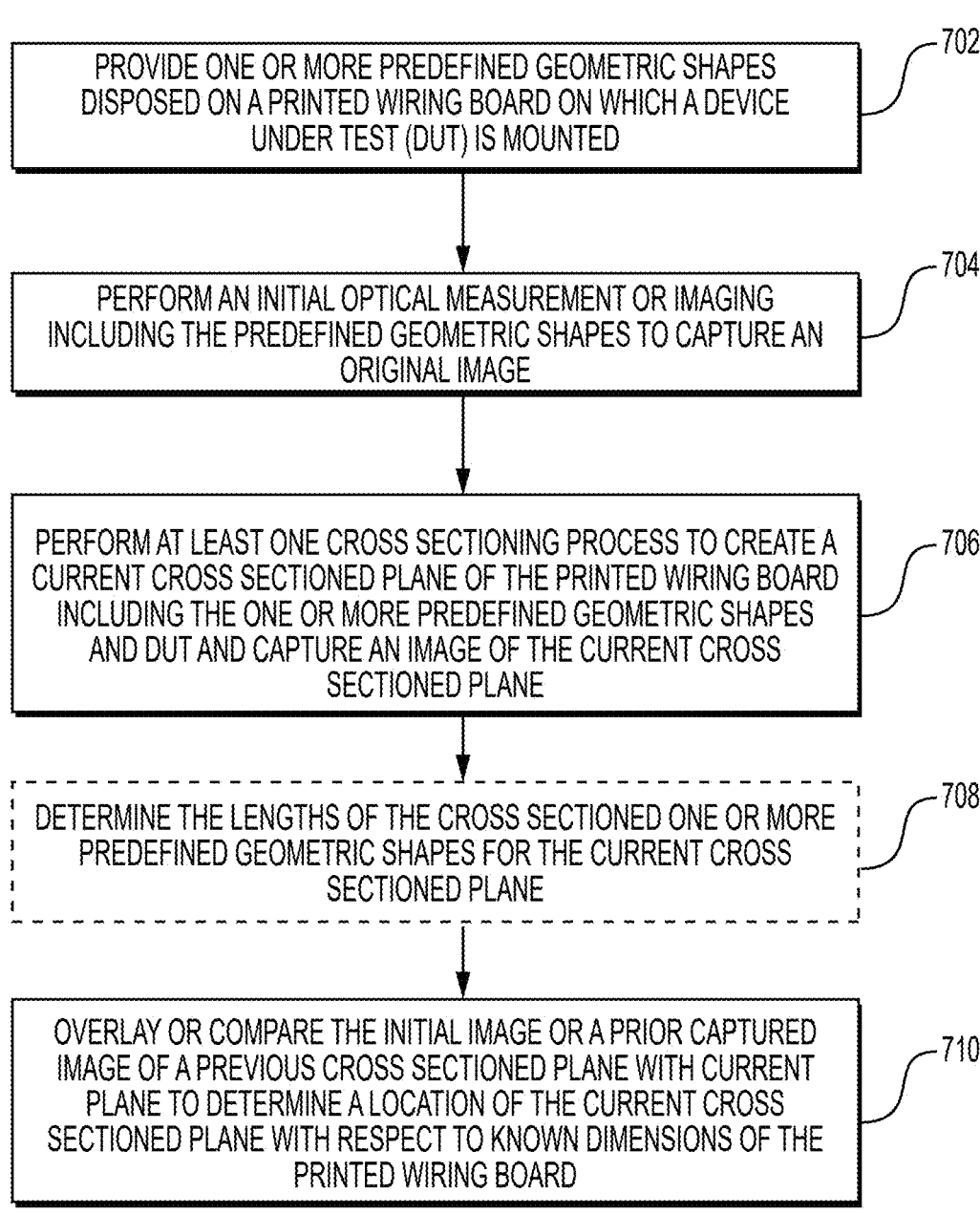

PROVIDE ONE OR MORE PREDEFINED GEOMETRIC SHAPES DISPOSED ON A PRINTED WIRING BOARD ON WHICH A DEVICE UNDER TEST (DUT) IS MOUNTED ⟋702

PERFORM AN INITIAL OPTICAL MEASUREMENT OR IMAGING INCLUDING THE PREDEFINED GEOMETRIC SHAPES TO CAPTURE AN ORIGINAL IMAGE ⟋704

PERFORM AT LEAST ONE CROSS SECTIONING PROCESS TO CREATE A CURRENT CROSS SECTIONED PLANE OF THE PRINTED WIRING BOARD INCLUDING THE ONE OR MORE PREDEFINED GEOMETRIC SHAPES AND DUT AND CAPTURE AN IMAGE OF THE CURRENT CROSS SECTIONED PLANE ⟋706

DETERMINE THE LENGTHS OF THE CROSS SECTIONED ONE OR MORE PREDEFINED GEOMETRIC SHAPES FOR THE CURRENT CROSS SECTIONED PLANE ⟋708

OVERLAY OR COMPARE THE INITIAL IMAGE OR A PRIOR CAPTURED IMAGE OF A PREVIOUS CROSS SECTIONED PLANE WITH CURRENT PLANE TO DETERMINE A LOCATION OF THE CURRENT CROSS SECTIONED PLANE WITH RESPECT TO KNOWN DIMENSIONS OF THE PRINTED WIRING BOARD ⟋710

*FIG. 7*

OPTICAL PLANAR METROLOGY MOUNTING DEVICE AND METHODS FOR ABRASIVE CROSS-SECTIONING OF ELECTRICAL COMPONENTS

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 210936US01) is assigned to the United States Government and is available for licensing for commercial purposes. Licensing and technical inquiries may be directed to the Technology Transfer Office, Naval Surface Warfare Center Crane, email: Crane_T2@navy.mil.

FIELD

The present disclosure generally relates to metrology of electrical components or devices, and more particularly to an optical planar metrology mounting device or apparatus for cross sectioning of electrical components, and methods for performing metrology using the optical planar metrology mounting device or apparatus.

BACKGROUND

Optical planar metrology is a branch of metrology (the science of measurement) that focuses on measuring flat or planar surfaces using optical techniques. This field is crucial in various industries, including semiconductor manufacturing, precision engineering, aerospace, and optics. Optical planar metrology utilizes light-based techniques to make precise measurements and offers advantages such as non-contact measurement, high accuracy, and suitability for delicate or sensitive surfaces.

In an application of optical planar metrology for testing electrical devices, the internal physical evaluation of enclosed electrical devices, elements, or devices such as two terminal electrical devices including resistors or multilayer ceramic capacitors (MLCC) has historically been performed using standard metallurgical cross-sectioning techniques, also known as metallographic cross-sectioning. Examples of these known techniques involve creating an epoxy resin casting around a device under test (DUT) and manually removing material using mechanical abrasion, such as wet grinding abrasion techniques. These techniques are very effective for producing repeatable results, but are highly operator dependent. Further complexity and operator dependency arises when a specific area within the DUT must be visualized since there are no known reliable optical methods to quantify how much material has been removed during mechanical abrasion and, thus, no way to measure the location of the cross-section plane with respect to the overall device without performing X-ray imaging which can be very time consuming, especially if a computerized tomography (CT) X-ray scan is required to visualize internal features. Additionally, DUT mounting fixtures have been previously created to provide stability during casting as well as provide a test connection, but no known mounting solutions are available that provide rapid and accurate optical measurements of an absolute cross-section plane location.

SUMMARY

The presently disclosed invention provides in some examples an apparatus for metrology of electrical components using cross-sectioning. The apparatus includes a circuit board including a mounting area configured for mounting of an electrical component to the circuit board, and at least one predefined geometric shape composed of a material and disposed on a surface of the circuit board in proximity to the mounting area.

According to another aspect, an apparatus for metrology of electrical components using cross sectioning is disclosed that includes a printed wiring board including a mounting area on a surface of the printed wiring board and configured for mounting of an electrical component to the printed wiring board. The apparatus further includes at least two geometrically shaped traces disposed on the surface of the printed wiring board, each on respective sides of the mounting area generally along a line, wherein the apparatus is further configured for encasement of at least a portion thereof including the at least two geometrically shaped traces and the mounting area when the electrical component is mounted thereto.

In still further aspects, a method for metrology of electrical components using cross-sectioning is disclosed. The method includes providing one or more predefined geometric shapes disposed on a surface of a printed wiring board on which a device under test (DUT) is mounted. The method further includes performing an initial optical imaging including the one or more predefined geometric shapes and the DUT to capture an original image. Moreover, the method includes performing at least one cross sectioning process to create a current cross sectioned plane of the printed wiring board including cross sectioning through the one or more predefined geometric shapes and the DUT, capturing an image of the current cross sectioned plane, and comparing one of the original image or a prior captured image of a previous cross sectioned plane with the current cross sectioned plane to determine a location of the current cross sectioned plane with respect to known dimensions determined at least from the original image.

These and other aspects of the disclosure will become more fully understood upon a review of the detailed description, which follows. Other aspects, features, and embodiments of the present disclosure will become apparent to those of ordinary skill in the art, upon reviewing the following description of specific, example embodiments of the present disclosure in conjunction with the accompanying figures. While features of the present disclosure may be discussed relative to certain embodiments and figures below, all embodiments of the present disclosure can include one or more of the advantageous features discussed herein. In other words, while one or more embodiments may be discussed as having certain advantageous features, one or more of such features may also be used in accordance with the various embodiments of the disclosure discussed herein. In similar fashion, while example embodiments may be discussed below as device, system, or method embodiments it should be understood that such example embodiments can be implemented in various devices, systems, and methods.

BRIEF DESCRIPTION OF THE DRAWINGS

The detailed description of the drawings particularly refers to the accompanying figures in which:

FIG. 5 illustrates an elevation, section, or side view of illustrating a cross-section of the printed wiring board configuration of FIGS. 3 and 4 along the illustrated cross-sectioning line in FIG. 4 according to aspects of the present disclosure.

FIG. 7 illustrates an exemplary flow diagram of a method for using the disclosed printed wiring board with printed metal geometries for optical planar metrology and metallurgical cross sectioning according to aspects of the present disclosure.

DETAILED DESCRIPTION

Figure 1A:
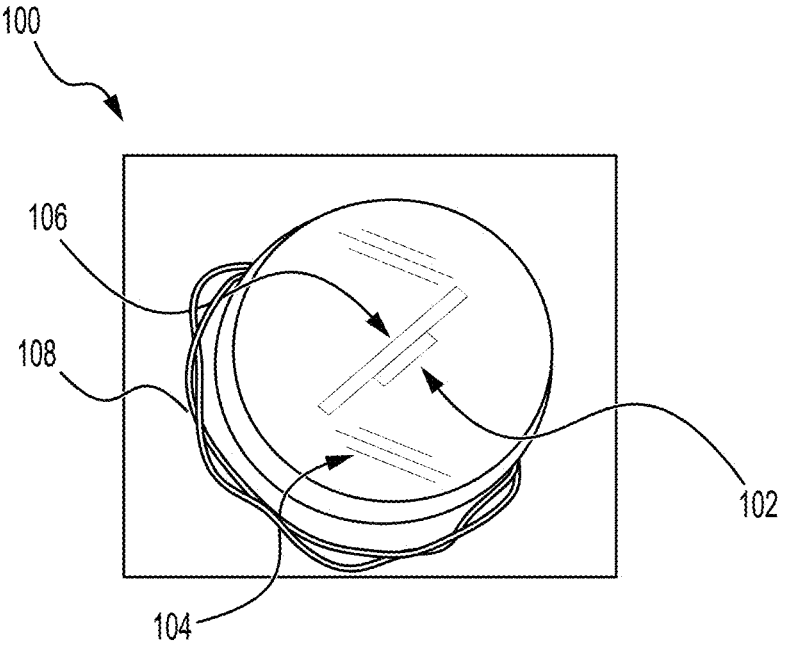
FIG. 1A illustrates a top or plan view of an example of a known arrangement used in metallurgical cross-sectioning techniques.

The embodiments and examples of the inventive concepts described herein are not intended to be exhaustive or to limit the presently presented invention to the precise forms disclosed. Rather, the embodiments and examples selected for description have been chosen to enable one skilled in the art to practice the presently disclosed invention.

In order to provide mounting solutions offering, in part, rapid and accurate optical measurements of an absolute cross-section plane location for metrology of electrical devices, the presently disclosed invention features a novel trace, shape, or array disposed on a mounting device and/or printed circuit board on which a sample DUT is mounted. In particular, the array may consist of printed metal traces arranged in array (e.g., a copper array), but not limited to such. In other aspects, generally the array may consist of any material that performs well in abrasive cross sectioning and is easily visible using optical microscopy techniques. Furthermore, the array may be configured in a particular geometric shape, such as a cone or triangle (or an interconnected aggregation or matrix of sub triangular shapes or triangular shaped metal traces that may further be arranged to form an overall triangular shape in the aggregate) that allows for visualization and measurement in the cross-section that can be superimposed on a plan (e.g., "top down") or elevation view of the image of a mounted sample to create two points on either side of the mounted sample for accurate location of the current section plane. The layout of the triangular shaped matrix ensures that no two cross-section planes will present with identical size and shape in the cross-section. In general, it is noted that the shape may be any shape that is capable of providing unique measurements, such as two unique measurements on either side of the DUT that will never repeat. Thus, the geometric shape could be, in some examples, a line trace disposed at an angle with respect to a cross section plane of the mounting device and/or printed circuit board or a shape with no line of symmetry in at least one dimension such as a rhomboid shape.

According to aspects, the presently disclosed invention provides a mounting apparatus for rapid and accurate optical measurements of a cross-section plane location of electrical components. In general, the mounting apparatus includes a circuit board that features a mounting area configured for mounting of an electrical component under test (e.g., a device under test (DUT), which may consist of a two terminal electrical component such as a resistor or capacitor) to the circuit board. Furthermore, the mounting apparatus includes at least one pre-defined geometric shape composed of a material and disposed on a surface of the circuit board in proximity to the mounting area. When the mounting apparatus is cross-sectioned, the pre-defined geometric shape in proximity to the mounting area and mounted electrical component, in particular, is cross-sectioned along a sectioning line including both the pre-defined geometric shape and the electrical component. The pre-defined geometric shape may be configured as an array of interconnected copper triangles to create an optically measurable unique feature for each cross-section resulting during the performance of plane optical planar metrology regardless of depth or overall planarity. The geometry of the copper triangle array ensures a unique cross-sectional profile for every plane and the copper material (or similar material having similar optical properties) allows for optical visibility and differentiation from surrounding materials.

Figure 1B:
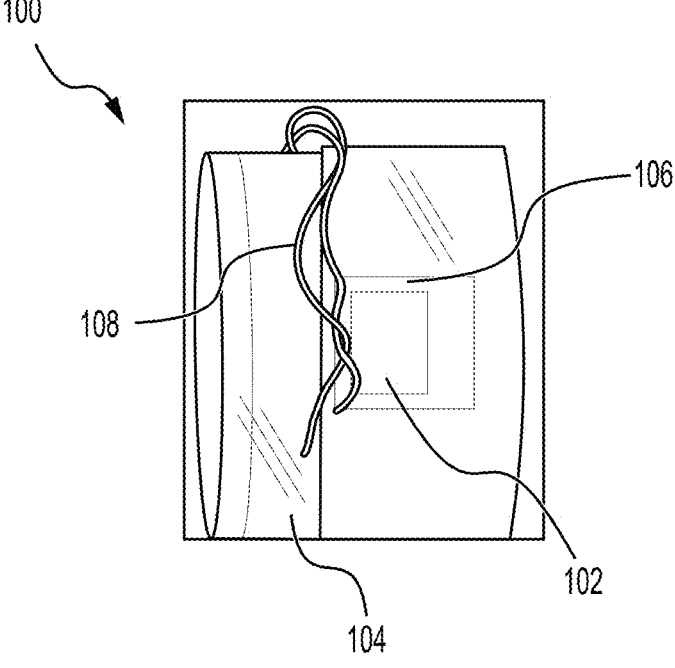
FIG. 1B illustrates a side or elevation view of the example FIG. 1A.

As was discussed earlier, known mounting fixtures have been used in metrology to stabilize electrical devices during the epoxy resin casting operations, as well as to provide wire leads or contacts for electrical testing after the electrical devices have been fully encapsulated. A visual example of this known technique is illustrated by FIGS. 1A and 1B. As may be seen in a plan or "top-down" view in FIG. 1A, the apparatus 100 includes an electrical device 102 encapsulated in an epoxy resin casting 104. Additionally, the electrical device 102 is mounted to a printed wiring board 106, which may also be electrically coupled to contacts or leads shown at 108 that extend out of the epoxy resin casting 104. FIG. 1B illustrates a side or elevation view of the apparatus 100 showing the electrical device 102 mounted to the printed wiring board 106, both being encapsulated in the epoxy resin casting 104. Additionally, the wire leads 108 coupled to the wiring board 106 and extending out of the casting 104 may be seen. FIGS. 1A and 1B illustrate that the use of the epoxy resin casting 104 makes it difficult to obtain a clear, undistorted optical image of the encapsulated device 102 through the epoxy resin casting 104.

Figure 2:
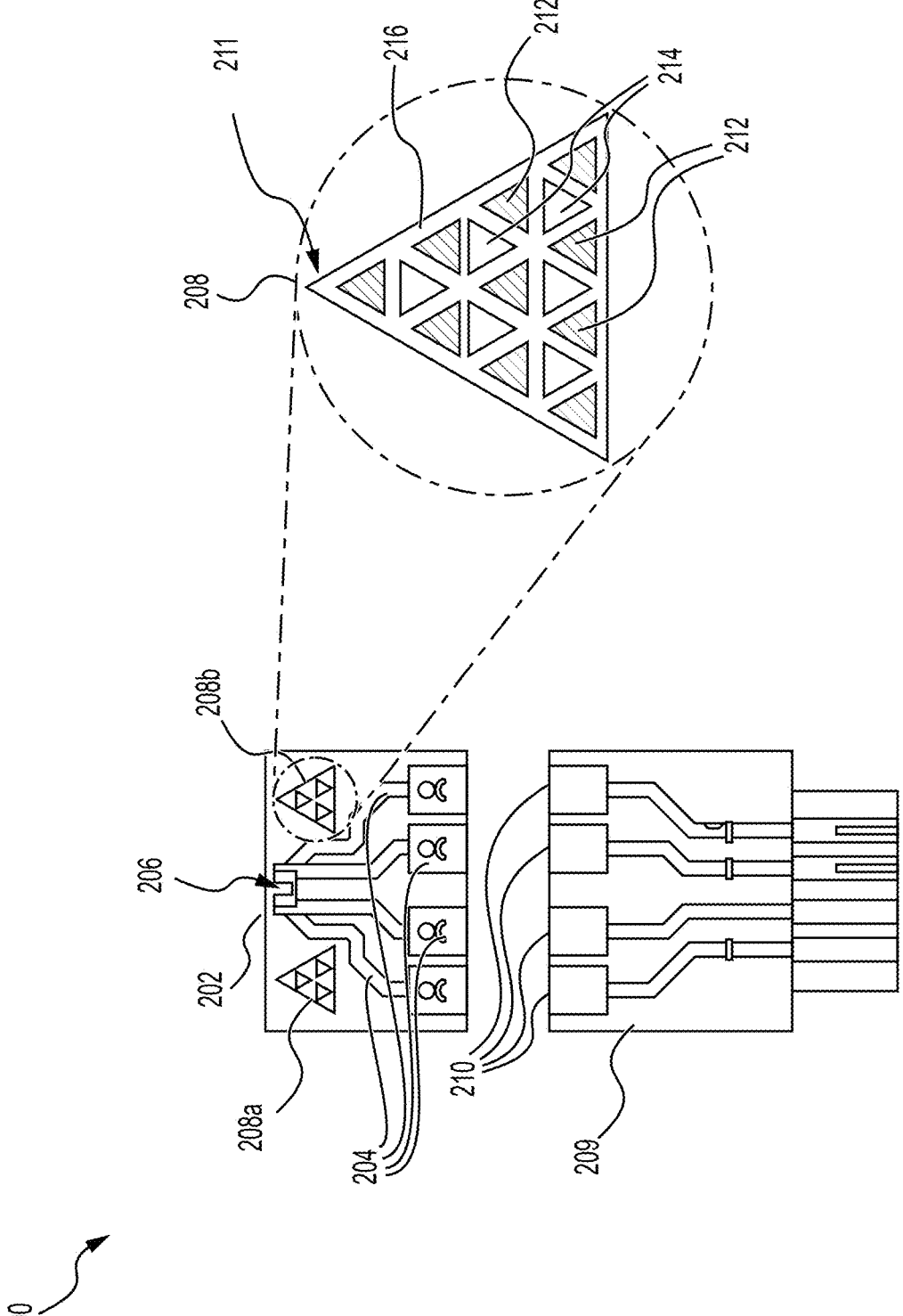
FIG. 2 illustrates a plan view of an example of a printed wiring board configuration employing printed metal geometries according to aspects of the present disclosure.

FIG. 2 provides an illustration of an exemplary printed wiring board (PWB) (or similar board or circuitry) including one or more predetermined geometric shaped printed arrays useful for optical planar metrology. As illustrated, FIG. 2 shows a PWB 202 having multiple trace conductors (e.g., traces and pads indicated by reference number 204) configured to electrically couple with a particular electrical component to be mounted on the PWB 202 generally at a mounting area or device location 206. The configuration of the PWB 202 and the traces/pads 204 is merely exemplary for a particular device, and it is noted that any number of configurations may be contemplated to meet the particular needs of an applicable cross-section.

In the present illustration of FIG. 2, at least one predefined geometric shape 208 is shown disposed in proximity to the mounting area or device location 206. In a particular aspect, the at least one predefined geometric shape 208 comprises two triangular shaped arrays 208a and 208b as shown, with each array 208 disposed on a respective side of and in proximity to the mounting area 206 for use in cross-section plane metrology. In a particular aspect, the present configuration uses a dual array of copper triangles for the arrays 208a and 208b on either side of the mounted DUT (not shown in this figure) disposed in mounting area 206, and these triangles 208a, 208b are then cross-sectioned with the DUT, as will be explained in more detail later. The PWB 202 may further be configured to couple with another electrical coupling wiring board 209 having mating contacts 210 complementary to contacts 204 and allowing input of electrical signals to the PWB 202.

It is noted further that using a geometric shape such as a triangle provides for an increasing distance from a point (e.g., 211) downward as the triangle has no line of symmetry in the vertical direction of triangle 208 as shown. In other alternative aspects, the geometric shape may be a line trace disposed at an angle with respect to a cross section plane of the PWB 202 (e.g., the top edge of PWB 202 shown in FIG. 2), or a shape with no line of symmetry in at least one or more dimensions such as a rhomboid, for example. Moreover, the geometric shape may be configured at a predetermined thickness to ensure visibility when cross sectioned.

A further beneficial feature of the triangle arrays 208 may be configured in a stacking pattern as further illustrated in the magnified view in FIG. 2. By stacking the triangles, much larger components can be cross-sectioned while maintaining the same planar measurement resolution. FIG. 2 shows four stacked rows, but the number could be more if necessary to accommodate a larger component under test, for example.

In one particular example as illustrated in FIG. 2, each triangle array 208 may be constructed using an array of triangles including areas having triangular areas that include copper material printed or deposited on the PWB 202 as shown at 212 and other triangular areas 214 that are free of copper material. Thus, when the DUT and the triangular shaped arrays 208 are cross-sectioned, a pattern with known distances will be present when viewed from an end or side view that can be used for determining distances. It is noted that the pattern illustrated in FIG. 2 is merely exemplary, and various other patterns, as well as shapes or geometries apart from triangular shapes, may be contemplated. Furthermore, the line pitch of the triangle array (e.g., the width of a line such as shown at 216) should be the smallest allowable for use of the known current or existing PWB fabrication capabilities. As will be appreciated by those skilled in the art, as the line pitch (i.e., the spacing between lines) is made smaller, this will improve the overall accuracy of the cross-sectional metrology.

Figure 3:
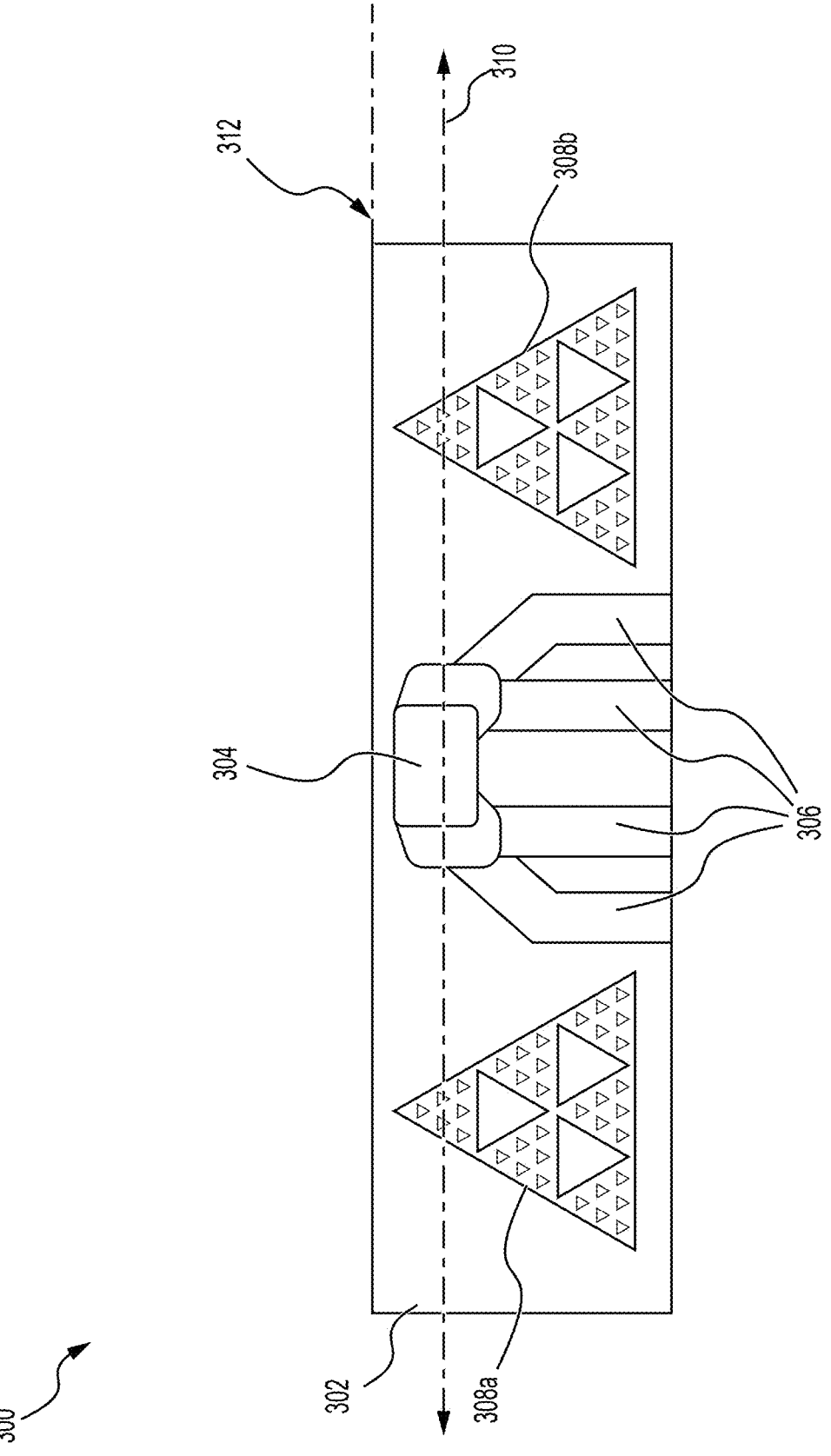
FIG. 3 illustrates a plan view of another example of a printed wiring board configuration employing printed metal geometries according to aspects of the present disclosure.

FIG. 3 illustrates a plan view 300 of another example of a printed wiring board configuration employing printed metal geometries according to aspects of the present disclosure. As shown, a printed wiring board (PWB) 302 includes device under test (DUT) 304 mounted to PWB 302. The DUT 304 is electrically coupled to traces 306 printed or deposited on PWB 302. Furthermore, the PWB 302 includes one or more printed arrays 308 on a surface of the PWB 302. In this particular example, there are two triangular shaped printed arrays 308a and 308b, each being disposed or located on a respective side of a two terminal DUT 304. Additionally, it is noted that similar printed wiring or mounting boards are presently used for cross-sectioning and electrical testing of two-terminal devices, except that the present disclosure provides the additional feature of one or more triangular shaped arrays 308 that afford optical determination of both planarity and location of a presently extant cross-section plane due to its visibility in optical microscopy.

In certain aspects, it is noted that the triangular shaped arrays (e.g., 308a and 308b) may be disposed, located, or placed on opposite or respective sides of the DUT (e.g., 304) such that the arrays may be cross-sectioned concurrently with the DUT. In particular, the triangular shaped arrays 308a and 308b are shaped traces (e.g., metal traces) disposed on the surface of the printed wiring board 302 in proximity to and on respective sides of the mounting area (e.g., the area where DUT 304 is mounted), where the placement is generally along a linear arrangement, linear direction, or line, shown at 310 as merely one example for visualization. In still further aspects, the linear direction or line 310 may be approximately parallel to a side of the board 302 (e.g., 312) so that when cross-sectioning is performed, the cross section will expose both the DUT 304 and the triangular shaped arrays 308a, 308b as will be illustrated in FIGS. 5 and 6.

According to further aspects, the apparatus illustrated in FIG. 3 is further configured for encasement of at least a portion thereof including the at least two geometrically shaped traces 308a, 308b and the mounting area (i.e., the area at which DUT 304 is mounted such that the DUT 304 is encapsulated or encased when the DUT 304 is mounted on the board 302. In still further aspects, the encapsulating or encasing may utilize epoxy resin or another other suitable material to encapsulate the arrays and the DUT.

For the process of metrology, prior to encapsulation (e.g., the encapsulation as shown in FIGS. 1A and 1B), an overall optical image of the mounted device (e.g., DUT 304) is captured with both triangular arrays (e.g., 308a, 308b) in the field of view as may be envisioned by the overall view shown in FIG. 3. This optical image may be acquired and saved using an optical metrology apparatus such as a microscope or other suitable digital camera systems that capture an image of sufficient quality and/or characteristics that allows for accurate optical metrology using the saved optical image.

Figure 4:
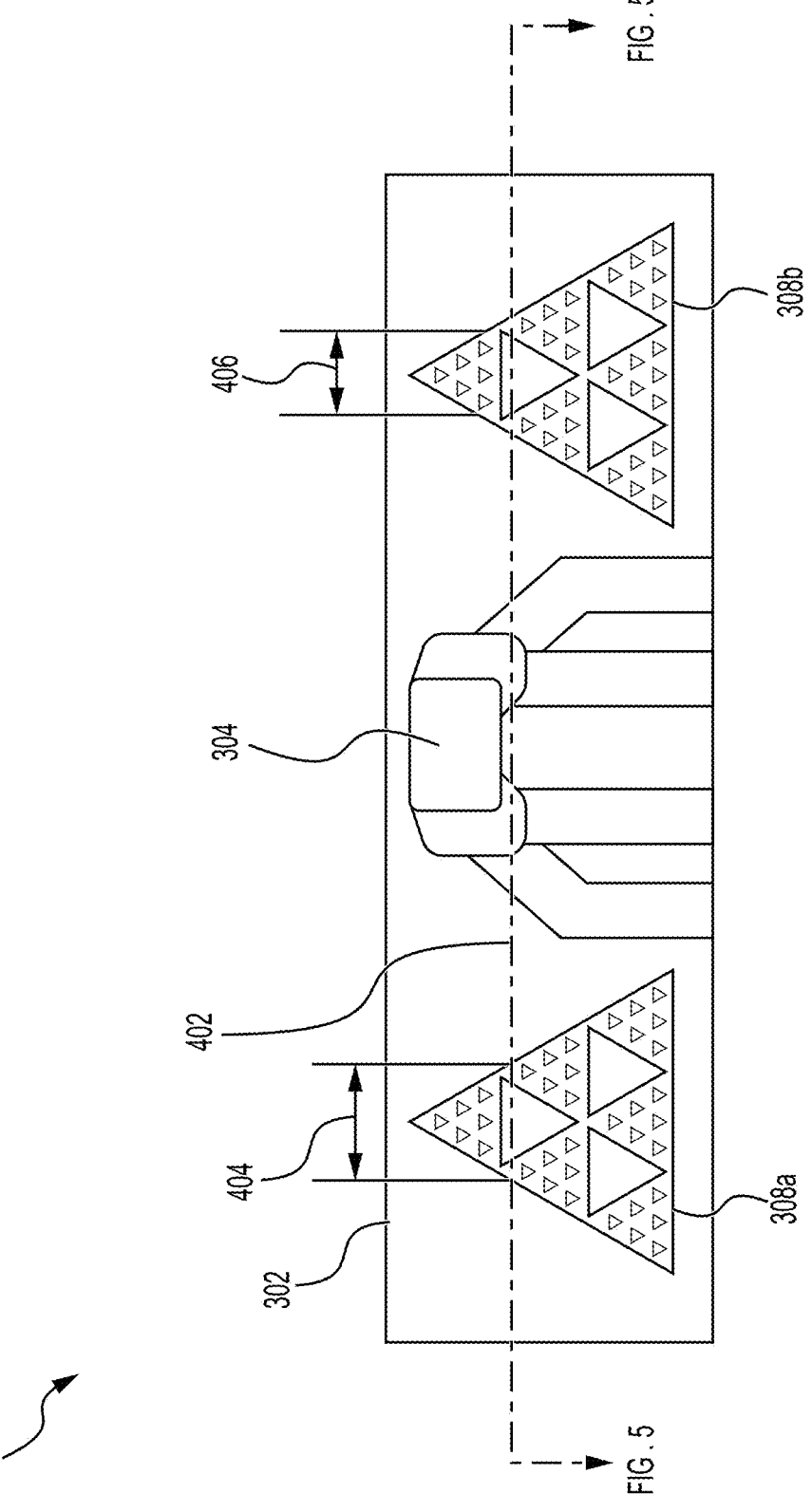
FIG. 4 illustrates another plan view illustrating a cross-sectioning line of the printed wiring board configuration of FIG. 3 according to aspects of the present disclosure.

FIG. 4 illustrates another plan view 400 illustrating an exemplary cross-sectioning line of the printed wiring board configuration of FIG. 3 according to aspects of the present disclosure. In particular, the illustration of FIG. 4 shows one example of a cross-sectioning line 402 at which a planar surface or plane would be created after removal of encapsulation material (not shown in FIG. 4) and a portion of the wiring board 302 resultant from at one point in the progression of cross sectioning operations (i.e., many such planar surfaces or planes may result from successive iterations of abrasive cross sectioning processes). As may be seen in FIG. 4, the cross section plane that would occur at line 402 passes through both of portions of the triangular arrays 308a and 308b and the DUT 304. The resultant cross sectional plane allows measurement of cross sectional lengths or distances 404 and 406 of the arrays 308a and 308b, which are, in turn, used to accurately measure and monitor the progression of cross sectioning. It is noted that the addition of the arrays 308a and 308b to the mounting fixture (i.e., PWB 302 and the mounting area (e.g., 206) engenders an ability to accurately monitor the progression of an abrasive cross-section process that was previously not possible. Accordingly, an operator is able to track the location of the cross-section plane (e.g., the plane shown in FIG. 5, which will be discussed later) in relation to external features of the device. The plane can also be mapped to internal features observed in x-ray using commercially available image manipulation software to overlay an x-ray image on the overall optical image.

FIG. 5 illustrates an elevation, section, or side view 500 showing a cross-section plane of the printed wiring board configuration of FIGS. 3 and 4 along the illustrated cross-sectioning line 402 shown in FIG. 4 according to aspects of the present disclosure. As illustrated, the cross sectioned plane (which is just one of a plurality of cross sectioned planes that might be created during a cross sectioning metrology process) reveals the cross section of the device under test 304, as well as the cross section lengths or distances of the arrays 308a and 308b disposed on a surface of the PWB 302 shown at 404 and 406, respectively. Optical metrology of the cross section shown may be used to measure or determine the lengths or distances 404 and 406, which provide rapid and accurate optical measurements of an absolute cross-section plane location of the plane along section line 402. Although not illustrated in FIG. 5, it is noted that the DUT 304 and the arrays 308a, 308b may be encapsulated in epoxy or equivalents as abrasive cross sectioning is typically performed after encapsulation to hold the component under test in place when subjected to abrasion techniques.

In further aspects, it is noted that an optical planar metrology method using the configuration shown in FIGS. 3-5 includes performing measurements of the triangle arrays in the cross-section (e.g., distances or lengths 404 and 406), which are then overlaid on the prior captured overall optical image to locate the current cross sectioned plane referenced to the overall device (e.g., termed also the "mounted device" such as DUT 304) prior to cross-sectioning as illustrated by FIGS. 3 and 4, for example. In this manner, a more accurate measurement is obtained based on the unique lengths (e.g., distances or lengths 404 and 406) of the cross sectioned triangular arrays that are compared to original (or prior taken) optical image.

Figure 6:
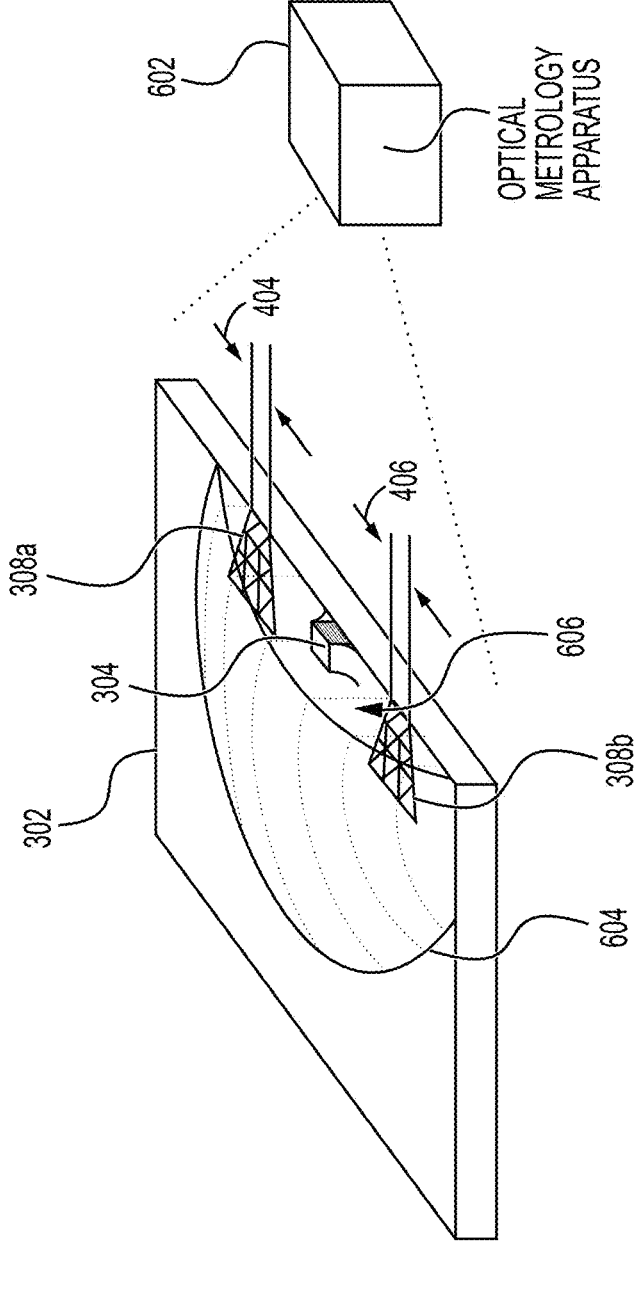
FIG. 6 illustrates a three dimensional view of a set up for performing optical planar metrology on the apparatus illustrated by FIGS. 3-5 according to some aspects of the present disclosure.

FIG. 6 illustrates a three dimensional view of a set up 600 for performing optical planar metrology on the apparatus illustrated by FIGS. 3-5 according to some aspects of the present disclosure. In this view, triangular shaped arrays 308a and 308b have been utilized, and further the PWB 302 has been cross sectioned at some point in the optical metrology process such that portions of the arrays 308a, 308b and DUT 304 have been removed. For each cross sectioned plane, an optical metrology apparatus 602 captures the elevation, side, or section view of assembly (i.e., the PWB 302, DUT 304, arrays 308a, 308b, and encapsulation material 604). In aspects, the optical metrology apparatus 602 may consist of one or more of a visible light optical microscope, other suitable digital camera systems, or even laser scanning microscopes in other examples.

Set up 600 also illustrates that at least a portion of PWB 302 is covered with an encapsulation material 604, such as an epoxy. Although the set up 604 only illustrates an example where just a portion of the PWB 302 is covered with the encapsulation material 604, those skilled in the art will appreciate that the entire surface of the PWB 302 may be encapsulated, or both top and bottom surfaces encapsulated such that the entirety (i.e., both or all sides of the PWB 302) are encapsulated, or also the PWB 302 and another complementary wiring board such as board 209 illustrated in FIG. 2 being encapsulated.

As further illustrated in FIG. 6, when cross sectioning is performed, each cross sectioning will result in a planar surface 606. The optical metrology apparatus 602 images each planar surface 606 for determining the measurements

404 and 406 for overlay or comparison to either the original image or the previously captured image in the cross sectioning iterations.

FIG. 7 illustrates an exemplary flow diagram of a method 700 for using the disclosed printed wiring board with predefined geometries or geometric shapes for increasing the accuracy of optical planar metrology and metallurgical cross sectioning according to aspects of the present disclosure. As shown, method 700 includes providing one or more predefined geometric shapes disposed on a printed wiring board on which a device under test (DUT) is mounted as shown in block 702.

Further, method 700 includes performing an initial optical imaging including the one or more predefined geometric shapes and the DUT to capture an original image as shown in block 704. Next, method 700 includes performing at least one cross sectioning process to create a current cross sectioned plane of the printed wiring board including cross sectioning through the one or more predefined geometric shapes and the DUT as shown in block 706. An example of the resultant cross sectioning is illustrated by FIG. 5 or 6 discussed above. Moreover, the processes of block 704 include capturing an capturing an image of the current cross sectioned plane, such as was illustrated in FIG. 5, as one example.

It is further noted in some aspects, method 700 may include determining lengths of the one or more predefined geometric shapes for the current cross-sectioned plane based on the captured image of the current cross-sectioned plane as shown by dashed or alternative block 708. This process affords measurement of the dimension of the geometric traces at the current cross sectioning, such as is shown by dimensions 404 and 406 in FIG. 4-6 discussed before. Such measurements can be correlated to locate current cross-sectioned plane location in some aspects.

Still further, method 700 may include overlaying or comparing one of the initial image or a prior captured image of a previous cross sectioned plane with the current cross sectioned plane to determine a location of the current cross sectioned plane with respect to known dimensions determined at least from the original image as shown in block 710. In further aspects, the processes of block 710 may include comparing the one of the initial image or the prior captured image of a previous cross sectioned plane with the current cross sectioned plane includes use of the determined lengths of the one or more predefined geometric shapes that were determined in alternate block 708.

In yet more aspects, method 700 may include the DUT comprising a two terminal electrical component selected from the group consisting of a resistor, a capacitor, and an inductor. As described herein, it is noted that the at least one predefined geometric shape may be constructed in one of a triangular shape, a rhomboid shape, or a diagonal linear shape.

According to still other aspects, it is noted that the at least one cross sectioning process shown in block 706 may include encapsulating the printed wiring board in an encapsulating material such as epoxy resin, and then performing mechanical abrasion or wet grinding abrasion on printed wiring board after encapsulation, wherein the mechanical abrasion or wet grinding abrasion creates the cross sectioning plane including abrasion of the one or more predefined geometric shapes and the DUT.

Figure 8:
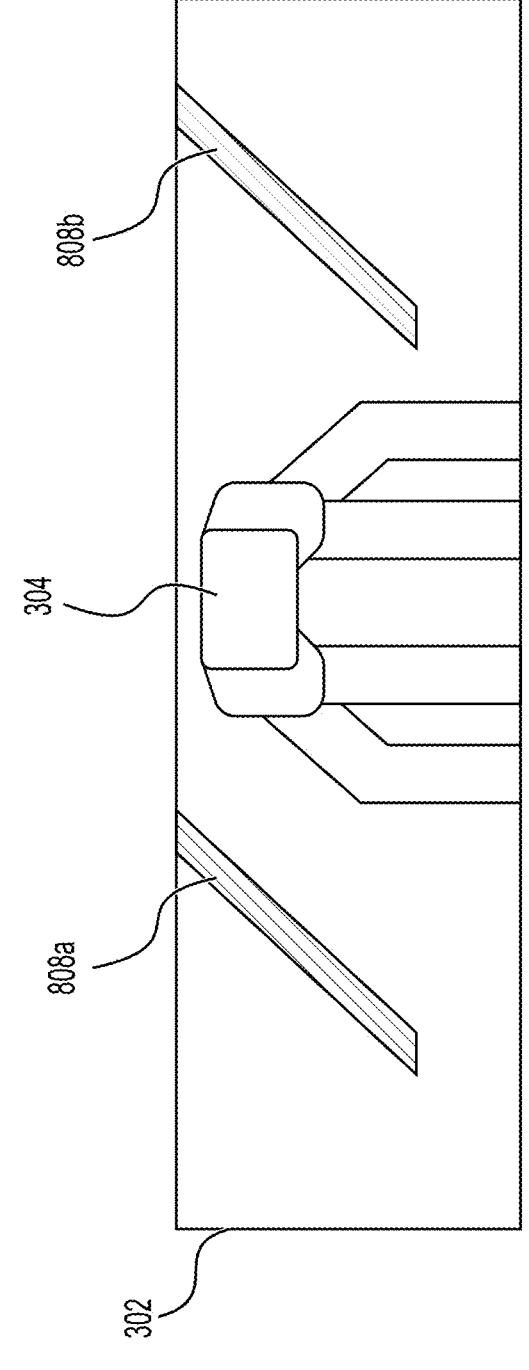
FIG. 8 illustrates a plan view of yet another example of a printed wiring board configuration employing particular geometries according to aspects of the present disclosure.

FIG. 8 illustrates a plan view 800 of yet another example of a printed wiring board configuration employing particular geometries according to aspects of the present disclosure. As mentioned before, the array or geometry may constitute a slanted trace, examples of which are shown at 808*a* or 808*b*.

Figure 9:
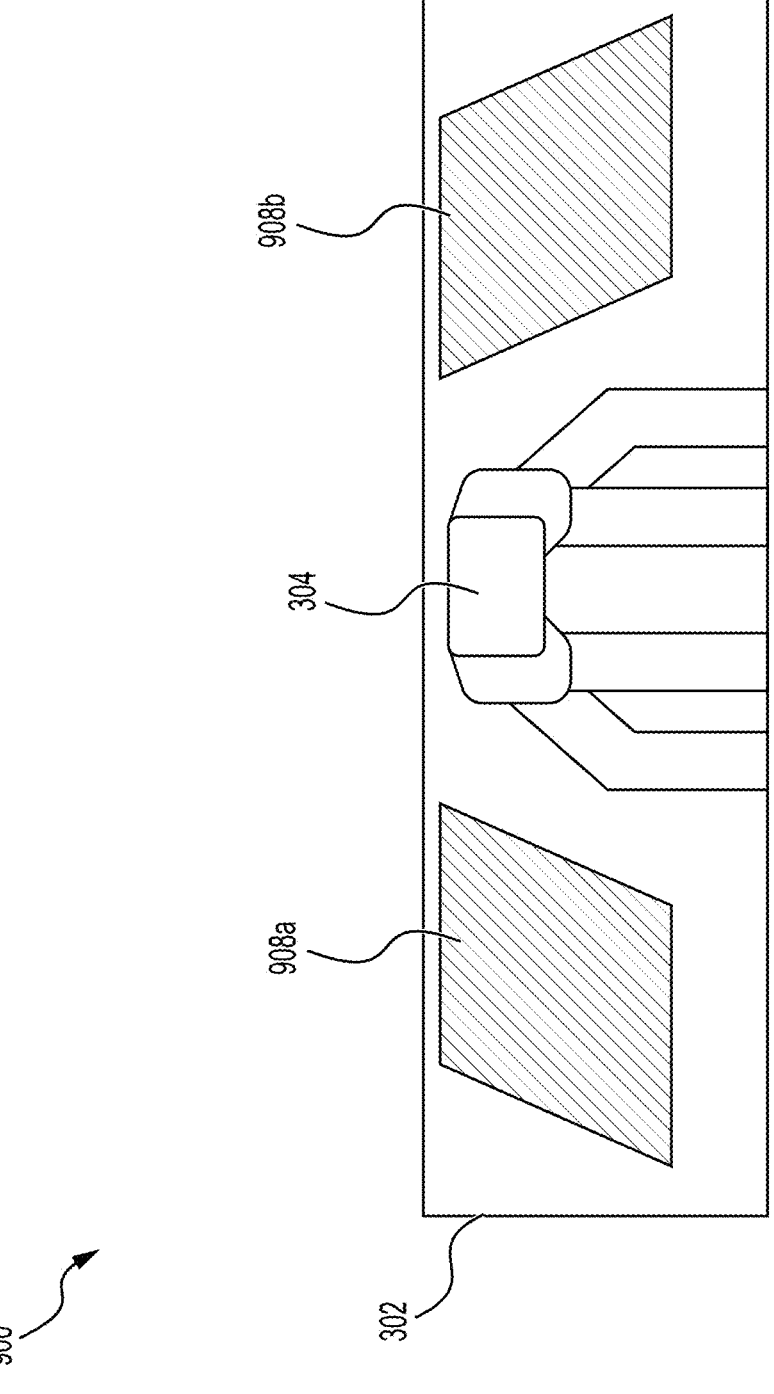
FIG. 9 illustrates a plan view of still one other example of a printed wiring board configuration employing particular geometries according to aspects of the present disclosure.

FIG. 9 illustrates a plan view 900 of still one more example of a printed wiring board configuration employing particular geometries according to aspects of the present disclosure. As mentioned before, the array or geometry may constitute a rhomboid shape, examples of which are shown at 908*a* or 908*b*.

Although the invention has been described in detail with reference to certain embodiments, variations and modifications exist within the spirit and scope of the invention as described and defined herein and as defined by the claims below.

The invention claimed is:

1. An apparatus for metrology of electrical components using cross sectioning, the apparatus comprising:

a circuit board including a mounting area configured for mounting of an electrical component to the circuit board; and at least one predefined geometric shape composed of a material and disposed as a trace on a surface of the circuit board in proximity to the mounting area, and having a predetermined thickness to ensure that the at least one predefined geometric shape is configured to perform well in abrasive cross sectioning of the circuit board such that the at least one predefined geometric shape is easily visible for optical microscopy techniques.

2. The apparatus of claim 1, wherein the electrical component comprises a two terminal electrical component.

3. The apparatus of claim 2, wherein the two terminal electrical component comprises one of a resistor, a capacitor, or an inductor.

4. The apparatus of claim 1, wherein the at least one predefined geometric shape comprises one of a triangular shape, a rhomboid shape, or a diagonal linear shape.

5. The apparatus of claim 4, wherein the triangular shape comprises an array of a plurality of triangular shaped traces disposed on the circuit board.

6. The apparatus of claim 1, wherein the material comprises copper.

7. The apparatus of claim 1, further comprising:

an encasing material disposed over at least a portion of the circuit board including the electrical component when disposed on the mounting area and the at least one predefined geometric shape.

8. An apparatus for metrology of electrical components using cross sectioning, the apparatus comprising:

a printed wiring board including a mounting area on a surface of the printed wiring board and configured for mounting of an electrical component to the printed wiring board; and at least two geometrically shaped traces disposed on the surface of the printed wiring board, each on respective sides of the mounting area generally along a line;

wherein the apparatus is further configured for encasement of at least a portion thereof including the at least two geometrically shaped traces and the mounting area when the electrical component is mounted thereto; and wherein the at least two geometrically shaped traces are composed of a material having a predetermined thickness to ensure that the at least two geometrically shaped traces are configured to perform well in abrasive cross sectioning of the printed wiring board such that the at least two geometrically shaped traces are easily visible for optical microscopy techniques.

9. The apparatus of claim 8, wherein the electrical component comprises a two terminal electrical component.

10. The apparatus of claim 9, wherein the two terminal electrical component comprises one of a resistor, a capacitor, or an inductor.

11. The apparatus of claim 8, wherein the at least two geometrically shaped traces each comprises one of a triangular shape, a rhomboid shape, or a diagonal linear shape.

12. The apparatus of claim 11, wherein the triangular shape comprises an array of a plurality of triangular shaped traces disposed on the surface of the printed wiring board.

13. The apparatus of claim 8, wherein the at least two geometrically shaped traces are comprised of a metal.

14. The apparatus of claim 8, further comprising:

an encasing material disposed over at least a portion of the surface of the printed wiring board including at least the electrical component when disposed on the mounting area and the at least two geometrically shaped traces.

15. The apparatus of claim 14, wherein the encasing material comprises an epoxy resin.

16. A method for metrology of electrical components using cross-sectioning comprising:

providing one or more predefined geometric shapes disposed on a surface of a printed wiring board on which a device under test (DUT) is mounted;

performing an initial optical imaging including the one or more predefined geometric shapes and the DUT to capture an original image;

performing at least one cross sectioning process to create a current cross sectioned plane of the printed wiring board including cross sectioning through the one or more predefined geometric shapes and the DUT;

capturing an image of the current cross sectioned plane; and comparing one of the original image or a prior captured image of a previous cross sectioned plane with the current cross sectioned plane to determine a location of the current cross sectioned plane with respect to known dimensions determined at least from the original image.

17. The method of claim 16, further comprising:

determining lengths of the one or more predefined geometric shapes for the current cross sectioned plane based on the captured image of the current cross sectioned plane; and wherein comparing the one of the original image or the prior captured image of a previous cross sectioned plane with the current cross sectioned plane includes use of the determined lengths of the one or more predefined geometric shapes.

18. The method of claim 16, wherein the DUT comprises a two terminal electrical component selected from the group consisting of a resistor, a capacitor, and an inductor.

19. The method of claim 16, wherein the at least one predefined geometric shape comprises one of a triangular shape, a rhomboid shape, or a diagonal linear shape.

20. The method of claim 16, wherein the at least one cross sectioning process comprises:

encapsulating the printed wiring board in an encapsulating material; and performing mechanical abrasion or wet grinding abrasion on printed wiring board after encapsulation, wherein the mechanical abrasion or wet grinding abrasion creates the cross sectioning plane including abrasion of the one or more predefined geometric shapes and the DUT.

* * * * *